(12) United States Patent
Mysore Rajagopal et al.

(10) Patent No.: US 10,749,336 B2
(45) Date of Patent: Aug. 18, 2020

(54) ESD PROTECTION CIRCUIT WITH PASSIVE TRIGGER VOLTAGE CONTROLLED SHUT-OFF

(71) Applicant: Texas Instruments Incorporated, Dallas, TX (US)

(72) Inventors: Krishna Praveen Mysore Rajagopal, Santa Clara, CA (US); Ann Margaret Concannon, Palo Alto, CA (US); Vishwanath Joshi, Richardson, TX (US); Aravind Chennimalai Appaswamy, Plano, TX (US); Mariano Dissegna, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 345 days.

(21) Appl. No.: 15/361,736

(22) Filed: Nov. 28, 2016

(65) Prior Publication Data

US 2018/0152019 A1 May 31, 2018

(51) Int. Cl.
*H02H 9/00* (2006.01)
*H02H 9/04* (2006.01)
*H01L 27/02* (2006.01)

(52) U.S. Cl.
CPC ......... *H02H 9/046* (2013.01); *H01L 27/0255* (2013.01)

(58) Field of Classification Search
CPC .............................. H02H 9/046; H01L 27/0255
See application file for complete search history.

(56) References Cited

U.S. PATENT DOCUMENTS

| 5,239,440 | A | 8/1993 | Merrill |
| 6,624,992 | B1 | 9/2003 | Aparin |
| 7,286,331 | B2 | 10/2007 | Choi |
| 7,821,752 | B2 | 10/2010 | Choi |
| 8,093,623 | B2 | 1/2012 | Mawatari et al. |
| 8,865,541 | B2 | 10/2014 | Farbiz et al. |
| 9,224,724 | B2 | 12/2015 | Salman et al. |
| 2012/0091504 | A1 | 4/2012 | Davis et al. |
| 2012/0161232 | A1 | 6/2012 | Farbiz et al. |

(Continued)

OTHER PUBLICATIONS

Richard Merrill and Enayet Issaq, "ESD Design Methodology", 1993 EOS/ESD Symposium, pp. 5b.5.1-5b.5.5, 1993.

(Continued)

*Primary Examiner* — Stephen W Jackson
(74) *Attorney, Agent, or Firm* — Rose Alyssa Keagy; Charles A. Brill; Frank D. Cimino

(57) ABSTRACT

Disclosed examples include an ESD protection circuit, including a transistor operative according to a control voltage signal at a control node to selectively conduct current from a protected node to a reference node during an ESD event, as well as a resistor connected between the control node and the reference node, a capacitor connected between the control node and an internal node, and a diode with an anode connected to the protected node and a cathode connected to the internal node to allow charging current to flow from the protected node to charge the capacitor and to provide a high impedance to the internal node to prevent or mitigate flow of leakage current from the internal node to the protected node to raise a trigger voltage of the protection circuit during normal operation.

20 Claims, 4 Drawing Sheets

(56) References Cited

U.S. PATENT DOCUMENTS

2013/0182357 A1* 7/2013 Brodsky ............ H01L 27/0281
361/56
2015/0146330 A1   5/2015 Appaswamy et al.
2015/0270253 A1   9/2015 Farbiz et al.
2016/0233668 A1   8/2016 Dai et al.
2017/0366002 A1* 12/2017 Zhao ................ H02H 9/046

OTHER PUBLICATIONS

Gao, Xiaofang, et al. "An improved electrostatic discharge protection structure for reducing triggering voltage and parasitic capacitance." Solid-State Electronics 47.6 (2003): 1105-1110.
Torres, Cynthia A., et al. "Modular, portable, and easily simulated ESD protection networks for advanced CMOS technologies." Microelectronics Reliability 42.6 (2002): 873-885.
Ker, Ming-Don, Hun-Hsien Chang, and Chung-Yu Wu. "A gate-coupled PTLSCR/NTLSCR ESD protection circuit for deep-submicron low-voltage CMOS ICs." Solid-State Circuits, IEEE Journal of 32.1 (1997): 38-51.
M. Stockinger et al. "Boosted and Distributed Rail Clamp Networks for ESD Protection in Advanced CMOS Technologies," EOS/ESD Symp. Proc., 2003, 10 pages.
M. Ker et al. "Flow to safely apply the LVTSCR for CMOS whole-chip ESD protection without being accidentally triggered on," Journal of Electrostatics 47 (1999), pp. 215-248.
Charvaka Duvvury and Carlos Diaz, "Dynamic Gate Coupling of NMOS for Efficient Output ESD Protection", Texas Instruments Incorporated, University of Illinois, IEEE/IRPS, 1992, pp. 141-150.

* cited by examiner

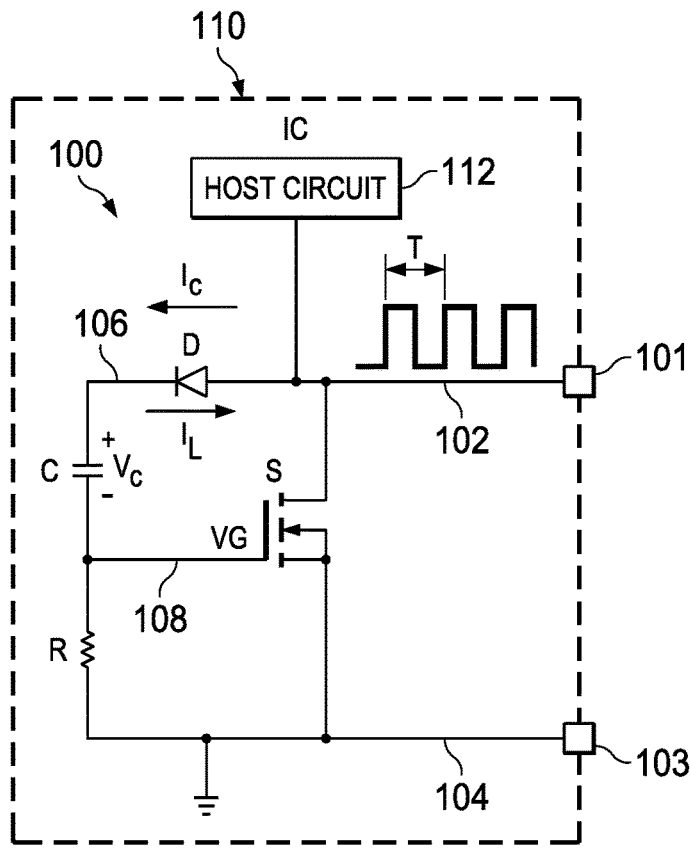
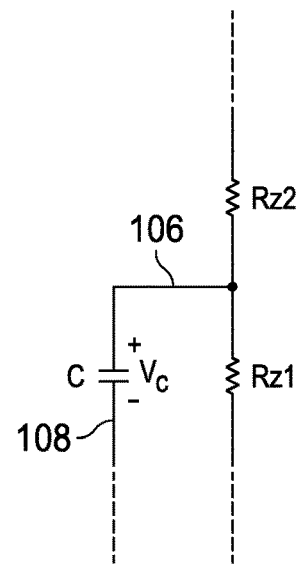
FIG. 1
FIG. 2
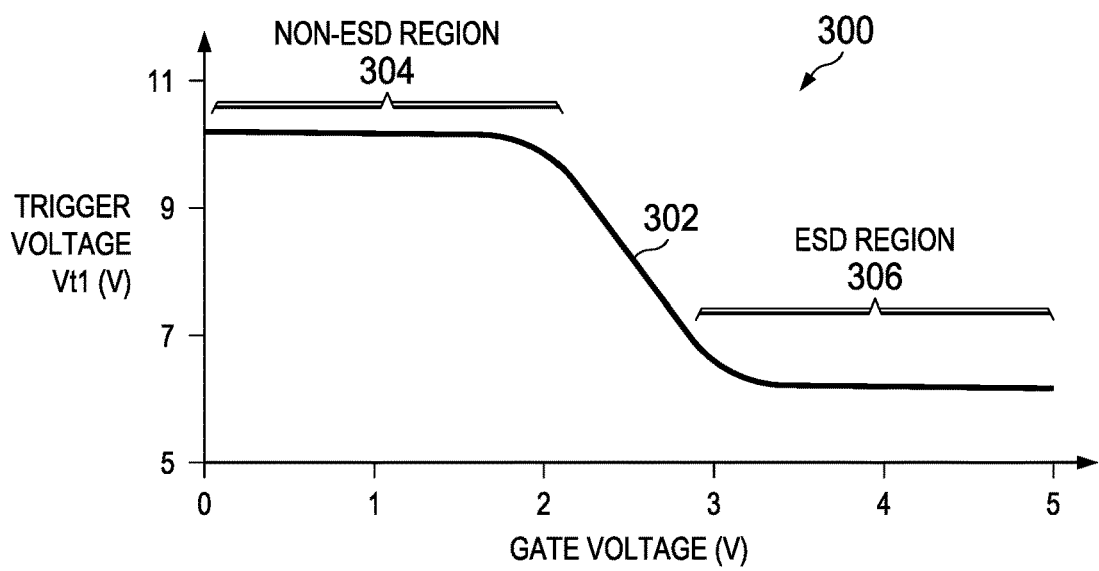
FIG. 3

ESD PROTECTION CIRCUIT WITH PASSIVE TRIGGER VOLTAGE CONTROLLED SHUT-OFF

BACKGROUND

Integrated circuits (ICs) are often subjected to electrostatic discharge (ESD) events through contact with a charged body (e.g., a human) that cause high voltages at one or more pins, pads or terminals of the IC. ESD events can damage an IC through thermal runaway and resultant junction shorting and/or dielectric breakdown causing gate junction shorting in metal oxide semiconductor (MOS) circuits when the amount of charge exceeds the capability of the electrical conduction path through the IC. ESD protection circuits or cells can be provided in an IC, such as clamp circuits to shunt ESD current between a protected pad and a reference node. The protected pad is often an I/O connection for conveying a time varying signal to the IC during normal operation. During normal operation, it is desirable to prevent false triggering of the ESD protection circuit due to the normal time varying signal applied to the I/O pad. Rate-triggered ESD protection circuits are often turned off during normal operation by active biasing or shut-off circuits including low-pass filter circuits and a shut-off transistor. After circuit power up, the low-pass filter provides a slowly rising gate signal to the shut-off circuit transistor which slowly turns on to disable or shut-off the ESD protection element. Conventional shut-off circuits occupy valuable area of an integrated circuit die, increases the component count and may need to be placed in an isolation region of an integrated circuit. In addition, the active shut-off circuitry can add a leakage path from power rails and decrease circuit reliability. Further, conventional active shut-off circuits increase the design and testing complexity and may decrease circuit reliability, and made themselves need protection against ESD events.

SUMMARY

Disclosed examples provide ESD protection circuitry and integrated circuits including a transistor or other ESD protection element that operates according to a signal at a control node to selectively conduct current from a protected node to a reference node during an ESD event. The ESD protection circuit further includes a resistor connected between the control node and the reference node and a capacitor connected between the control node and an internal node. A blocking circuit such as a diode is connected between the protected node and the internal node to allow charging current to flow from the protected node to charge the capacitor and to provide a high impedance to the internal node to prevent or mitigate flow of leakage current from the internal node to the protected node. In certain examples, the capacitor and blocking circuit are selected so that a time constant representing the product of the capacitance and a diode leakage resistance is greater than the period of the time-varying signal on the protected node to mitigate or avoid leakage current from the capacitor during normal operation. The resistor in certain examples allows current to flow from the capacitor to the reference node to increase the amplitude of the control voltage signal to turn the ESD protection element on in response to an ESD event that raises the protected node voltage beyond a peak amplitude of the time-varying signal on the protected node, and the resistor allows current to flow from the capacitor in response to attenuation of the ESD event to reduce the amplitude of the control voltage signal to turn the ESD protection element off.

BRIEF DESCRIPTION OF THE DRAWINGS

FIG. 1 is a schematic diagram of an integrated circuit (IC) with an ESD protection circuit including a passive trigger voltage controlled shut-off circuit with a capacitor and a high impedance discharge path to reduce rate sensitivity and increase a trigger voltage of the ESD protection element during normal non-ESD operation of an integrated circuit.

FIG. 2 is a schematic diagram of an impedance model of the high impedance discharge path of the ESD protection circuit in FIG. 1.

FIG. 3 is a graph of a Fermi function of a trigger voltage of the ESD protection element in the ESD protection circuit of FIG. 1.

DETAILED DESCRIPTION

Figure 4:
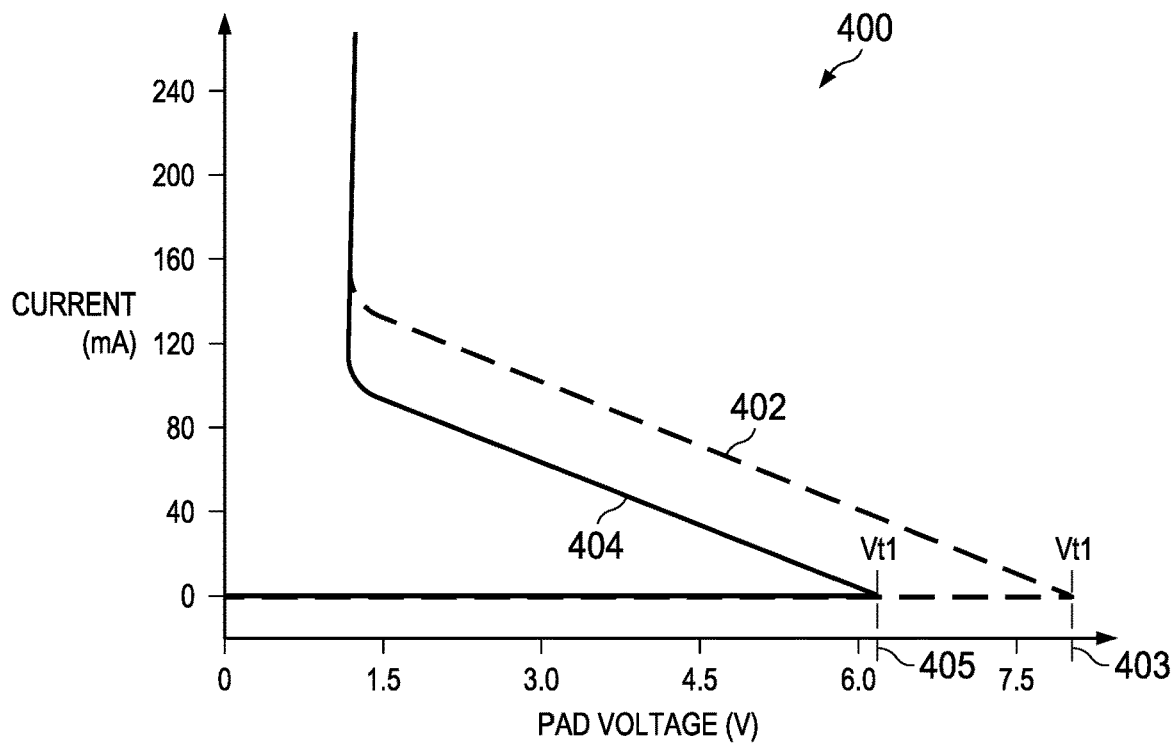
FIG. 4 is a graph showing simulated comparative ESD protection element current curves as a function of gate voltage for the ESD protection circuit of FIG. 1 and for a conventional ESD protection circuit.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Integrated circuits may be damaged by an ESD event during manufacturing, assembly, testing, or during normal operation in a given application. As described herein, an ESD stress event can be understood as including an event on an I/O or power pad or other externally accessible node of a circuit that creates an elevated voltage (e.g., with respect to VSS or other voltage reference node) that is higher than a voltage which is normally supplied to the pad (e.g., higher than VDD) or other ESD event that can stress or degrade a circuit component unless attenuated by ESD protection circuitry. For example, an ESD stress event may include events used in testing ESD immunity classification for the human body model (HBM Classes 0, 1A, 1B, 1C, 2, 3A and 3B), the charge device model (CDM Classes C1, C2, C3, C4, C5 and C6), and the machine model (MM Classes M1, M2, M3 and M4). The Human Body Model simulates ESD due to discharge from human beings, and the various levels of the HBM classifications are often used to describe an ESD stress event. CDM simulates the discharge of a charged device when it comes in contact with a conductive material, and MM represents a discharge from an object to the component. Many ICs include host circuitry that can be damaged by ESD events that deliver high voltages to one or more IC terminals (e.g., pins, pads).

FIG. 1 shows an example ESD protection circuit 100 for a protected node 102 and associated pad 101 in an integrated circuit 110. Although a single ESD protection circuit 100 is shown in FIG. 1, multiple protection circuits 100 can be provided in practice, individually associated with an associated protected node and/or protected pad for protection against ESD events. Disclosed ESD protection circuit examples provide a reverse-biased PN junction to trap charge at an internal node 106 in a rate sensitive ESD cell that disables rate-sensitivity during normal operation (non-ESD) of the IC 110. In operation, the protection circuit trigger voltage is effectively increased during normal operation, while allowing the ESD protection element to be turned on in response to an ESD event that raises the voltage at the protected node above a peak amplitude of a time-varying signal normally applied to the protected node in operation. This operation increases immunity to false triggering and reduces leakage across power rails. In addition, the disclosed protection circuit 100 uses charge to bias the internal node 106 from signal and/or supply lines without additional active shut-off circuits. The disclosed examples provide solutions to reliably turn the protection circuit off during normal operation without active shut-off biasing circuitry, and facilitate reduced area as well as reduced design and testing complexity, along with increased reliability.

The ESD protection circuit 100 in FIG. 1 includes an active clamp circuit with an ESD protection element S. In the illustrated example, the ESD protection element S is an NMOS shunt transistor S coupled between first and second circuit nodes 102 and 104, respectively. In this example, the ESD protection element S protects the first circuit node 102 and the associated IC pad 101 against elevated voltages associated with an ESD event in connection with the IC 110. Although the example protection circuit 100 in FIG. 1 includes a MOSFET S operating as the main ESD protection element, other devices can be used, including without limitation another type or form of MOS element, a MOS-SCR, a bipolar transistor or other switching device in other embodiments. The second circuit node 104 can be a reference, such as a circuit ground, and the node 104 in one example is connected to an associated IC pad 103. The IC pads 101 and 103 in certain examples are integrated circuit pins or terminals providing electrical conductivity to external circuits, such as circuits of a host printed circuit board (PCB) (not shown) of which the IC 110 is a component. In one example, the protected node 102 is connected to an I/O pad or pin 101 of the IC 110, and the protected node 102 provides a time-varying I/O from an external circuit (not shown) to a host circuit 112 of the IC 110, such as a logic circuit, microprocessor, etc. In other examples, the ESD protection circuit 100 can be used to protect a supply node against ESD events.

The protection circuit 100 includes an ESD protection element S connected between the protected node 102 and the reference node 104. The ESD protection element S operates according to a control voltage signal VG (e.g., a gate voltage) at a control node 108 to selectively conduct current from the protected node 102 to the reference node 104. In one example, the ESD protection element is an n-channel field effect transistor (FET) e.g., NMOS that includes a drain connected to a protected node 102, a source connected to a reference node 104, and a gate control terminal 108 connected to a control node 108. Other ESD protection components or elements can be used, such as bipolar transistors (e.g., NPN transistor), other types of FETs, SCRs, or other semiconductor-based switching devices selectively operable according to a voltage or current signal applied to a control terminal thereof in order to selectively conduct ESD event current from the protected node 102 to the reference node 104.

The ESD protection circuit 100 and FIG. 1 also includes a resistor R, a capacitor C, and a blocking component or blocking circuit D. In operation, the capacitor C, the resistor R and the blocking component D operate as a passive shut-off circuit to turn off the ESD protection element S during normal operation of the IC 110. In addition, the blocking component D allows the capacitor C to charge during normal operation, and presents a high impedance to an internal node 106 connected to the capacitor C in order to prevent or mitigate discharging of the capacitor C in normal operation. In response to an ESD event that raises the voltage at the protected node 102, the charged capacitor C conducts current through the resistor R in order to raise the control voltage VG in order to turn on the ESD protection element S.

The capacitor C includes a lower first terminal connected to the control node 108 and an upper second terminal connected to an internal node 106. The blocking component D is connected between the protected node 102 and the internal node 106. In operation, the blocking component D provides a conduction path from the protected node 102 to the internal node 106 to allow charging current $I_C$ to flow from the protected node 102 to charge the capacitor C. In addition, the blocking component D provides or presents a high impedance to the internal node 106 to prevent or mitigate flow of leakage current $I_L$ from the internal node 106 to the protected node 102. In one example, the blocking component is a diode D, including an anode connected to the protected node 102 and a cathode connected to the internal node 106. In other possible examples, the blocking component can be a diode-connected transistor such as a MOSFET, a bipolar transistor or other component that provides a PN junction between the protected node 102 and the internal node 106. In certain examples, the capacitance of the capacitor C and the size of the diode D are selected so that the time constant τ=the product of the capacitance and the leakage resistance $R_Z$ of the diode D is greater than a period T of a time-varying signal on the protected node 102 during normal operation.

The resistor R is connected between the control node 108 and the reference node 104. In operation, the resistor R allows current to flow from the capacitor C to the reference node 104 to increase the amplitude of the control voltage signal VG to turn on the ESD protection element S in response to an ESD event causing a voltage rise at the protected node 102 beyond a peak amplitude of the time-varying signal on the protected node 102. The resistor R also facilitates shut-off of the ESD protection element S following an ESD event. In particular, the resistor R allows current to flow from the capacitor C in response to attenuation of the ESD event when the ESD protection element S is on to reduce the amplitude of the control voltage signal VG to turn the ESD protection element S off.

Referring also to FIGS. 2 and 3, the high impedance provided by the blocking component D provides a trigger voltage-controlled shut-off circuit with a controlled trigger voltage Vt1. The ESD protection circuit 100 controls rate-triggering or other inadvertent triggering of the ESD protection element S during normal operation by providing a high impedance discharge network across the triggering circuitry. In operation, the blocking component D effectively controls charge displacement across the trigger element and the displacement charge mechanism disables rate-sensitivity by providing a high trigger voltage Vt1 during non-ESD operation. FIG. 2 shows an impedance model of the high impedance discharge path of the ESD protection circuit 100 in FIG. 1, where the internal note 106 is connected to the upper terminal of the capacitor C, and the impedance of the PN junction provided by the blocking component D is represented as resistances $R_{Z1}$ and $R_{Z2}$. In normal operation with a time-varying signal applied to the protected node 102 via the pad 101, the voltage $V_C$ across the capacitor C is given by the following equation (1):

$$V_C(t) = V_0(t)e^{-t/\tau}, \quad (1)$$

where $V_0(t)$ is the initial capacitor voltage, t is the time, and τ is the time constant representing the product of the capacitance C and the leakage resistance $R_Z$ of the diode D.

In certain implementations, the capacitor C and the blocking component D are selected such that the time constant is greater than the period T of the time-varying signal applied to the protected node 102 during normal operation according to the following equation (2):

$$\tau = R_Z * C > T. \quad (2)$$

This condition facilitates mitigation or avoidance of leakage current through the blocking component D from the internal not 106 to the protected node 102. In this regard, the time-varying signal applied to an I/O node via the IC pin or pad 101 can be a generally periodic pulse signal having a peak amplitude. When the dv/dt of rising edges in the time-varying I/O signal forward bias is the blocking component D, displacement current flows through the blocking component D to charge the capacitor C. However, the high impedance resented by the reverse biased PN junction of the blocking component D essentially prevents discharging current from flowing out of the capacitor C to the protected node 102. The leakage resistance $R_Z$ of the blocking component D represents the ratio of the reverse bias voltage of the PN junction divided by the leakage current $I_L$.

In the model representation of FIG. 2, the leakage resistance of the high impedance discharge network provided by the blocking component D is represented as a resistance $R_Z$ according to the following equation (3):

$$R_Z = (R_{Z1} * R_{Z2})/(R_{Z1} + R_{Z2}). \quad (3)$$

FIG. 3 provides a graph 300 showing a Fermi function curve 302 representing the trigger voltage Vt1 of the ESD protection element S in the ESD protection circuit 100 of FIG. 1. The curve 302 illustrates the rate sensitivity of the ESD protection circuit 100, which provides a high trigger voltage Vt1 during normal operation in a non-ESD region 304, and a significantly lower trigger voltage Vt1 in an ESD region 306. In practice, the high trigger voltage Vt1 in the non-ESD region 304 mitigates false triggering of the ESD protection circuit 100 during normal operation in which the time-varying signal on the protected node 102 is within an expected amplitude range. During this operation, the capacitor C is charged by displacement current flow from the protected node 102 to the internal node 106, with the resistor R maintaining a low gate control voltage VG at the control terminal 108 of the ESD protection element S. In this operation, the control voltage signal VG stays low, and prevents inadvertent turn on of the ESD protection element S. The protection circuit 100 thus provides a high Vt1 during non-ESD operation in the range 304 of FIG. 3, with the time constant τ>T preventing displacement current flow out of the capacitor C. In this manner, a low leakage PN junction can be employed to control rate sensitivity of the ESD protection circuit 100 with respect to the signal rate of the time-varying signal present on the protected node 102.

When an ESD event occurs, the voltage of the protected node 102 rises above the peak amplitude of the expected time-varying signal, causing forward biasing of the PN junction of the blocking component D. The upper terminal of the charged capacitor C will be one diode drop below the voltage of the protected node 102, and the recharging of the capacitor C raises the amplitude of the control voltage signal VG at the control node 108 through conduction of current from the lower terminal of the capacitor C through the resistor R. This increase in the control voltage signal VG turns on the ESD protection element S, which in turn conducts ESD current from the protected node 102 to the reference node 104. The protection element S thus provides an alternate path for flow of ESD current, thereby protecting the host circuit 112 connected to the protected node 102. In this manner, forward biasing of the blocking component D during an ESD event effectively lowers the trigger voltage Vt1 of the protection circuit 100 in the ESD region 306 for higher gate voltages VG as shown in FIG. 3.

FIG. 4 provides a graph 400 illustrating simulated operation of the circuit 100, showing the pad voltage at the protected node 102 in FIG. 1 as a function of current flow through the ESD protection element S. The graph 400 includes a first curve 402 showing operation of the ESD protection circuit 110 resulting in a trigger voltage Vt1 403 above 7.5 V. A second curve 404 in FIG. 4 illustrates simulated operation of the circuit 100 with the blocking component D short-circuited. As seen in the simulation results of FIG. 4, removal of the high impedance provided by the blocking component D allows displacement current to flow out of the capacitor C in normal operation, and the resulting circuit exhibits a much lower Vt1 405 just above 6.0 V. The simulated comparative ESD protection element current curves 402 and 404 illustrate the enhanced trigger voltage Vt1 in normal operation achieved by the circuit 100 including the blocking component D as described above.

Figure 5:
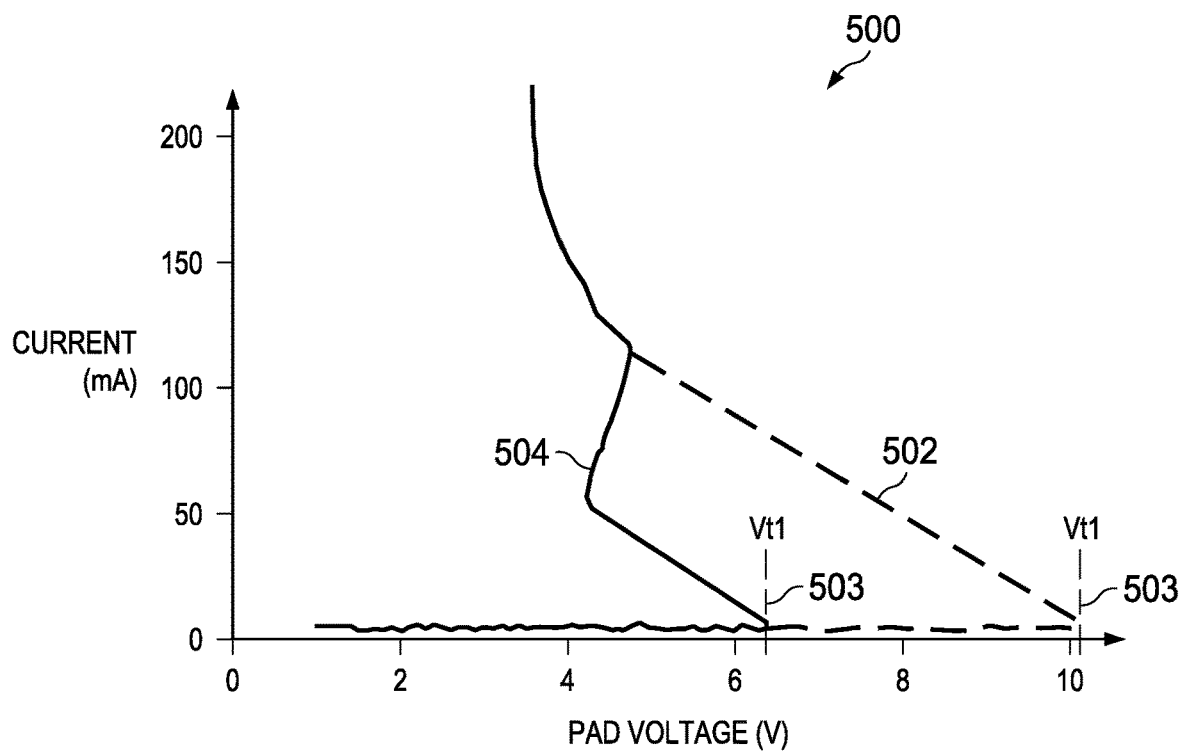
FIG. 5 is a graph showing measured transmission line pulsing (TLP) ESD protection element current curves as a function of gate voltage for the ESD protection circuit of FIG. 1 and for a conventional ESD protection circuit.

FIG. 5 provides a graph 500 illustrating measured transmission line pulsing (TLP) testing of an example of the circuit 100 using trapezoidal pulses to sweep the pad voltage at the protected node 102 from zero through 12 V. FIG. 5 shows a first curve 502 representing the pad voltage is a function of the current flowing through the ESD protection element S. This measured example exhibits a high trigger voltage Vt1 503 above 10 V. FIG. 5 also shows a second curve 504 representing operation of the circuit with the blocking component D short-circuited, resulting in a much lower trigger voltage Vt1 505 of less than 7 V. The graph 500 and FIG. 5, like the simulated results shown in FIG. 4, illustrate that the novel ESD protection circuitry 100 provides enhanced immunity to false triggering and rate sensitivity compared with other designs. Moreover, as previously discussed, the circuit 100 avoids the need for active circuitry to shut off the protection element S, thereby conserving circuit space and cost of the host IC 110, and also reducing design and testing complexity for the IC 110.

Figure 6:
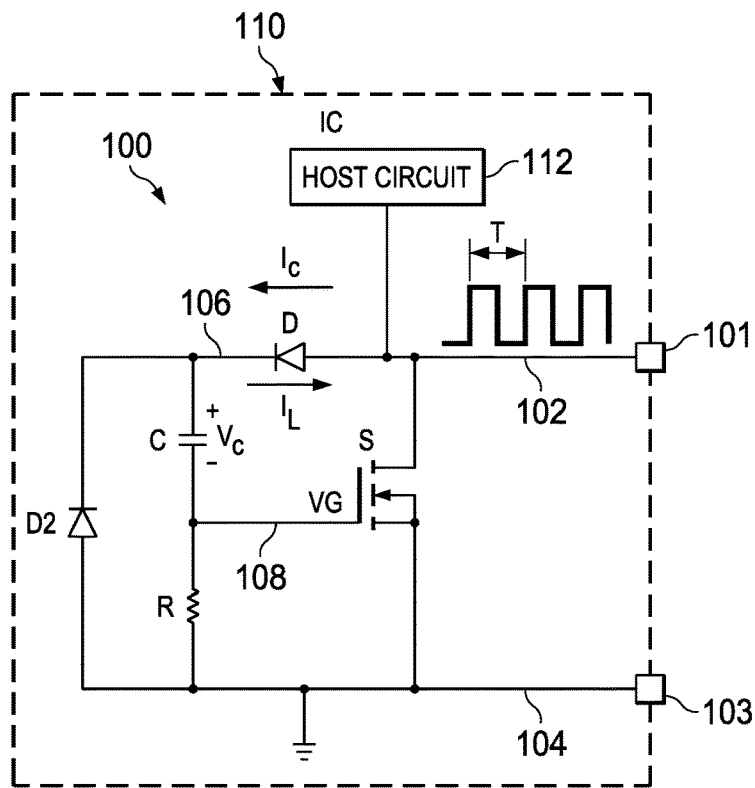
FIG. 6 is a schematic diagram showing an integrated circuit (IC) with an ESD protection circuit including a passive trigger voltage controlled shut-off circuit, with a second diode connected to the capacitor according to another embodiment.

FIG. 6 shows another integrated circuit embodiment 101 with an ESD protection circuit including a passive trigger voltage controlled shut-off circuit as described above in connection with FIG. 1, further including a second diode D2 connected to the capacitor C according to another embodiment. This configuration provides additional control at the upper capacitor node 106.

Figure 7:
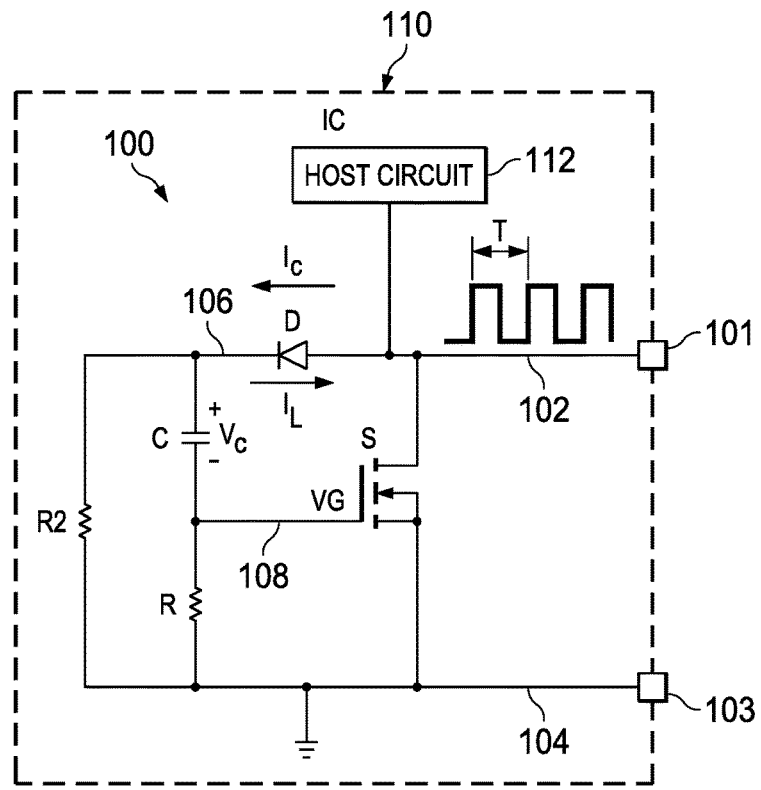
FIG. 7 is a schematic diagram showing an integrated circuit (IC) with an ESD protection circuit including a passive trigger voltage controlled shut-off circuit with a second resistor connected to the capacitor according to another embodiment.

FIG. 7 shows another integrated circuit embodiment 101 with an ESD protection circuit including a passive trigger voltage controlled shut-off circuit with a second resistor R2 connected to the capacitor C between the nodes 106 and 104 according to another embodiment for situations where the pad node 102 can accommodate more leakage.

Figure 8:
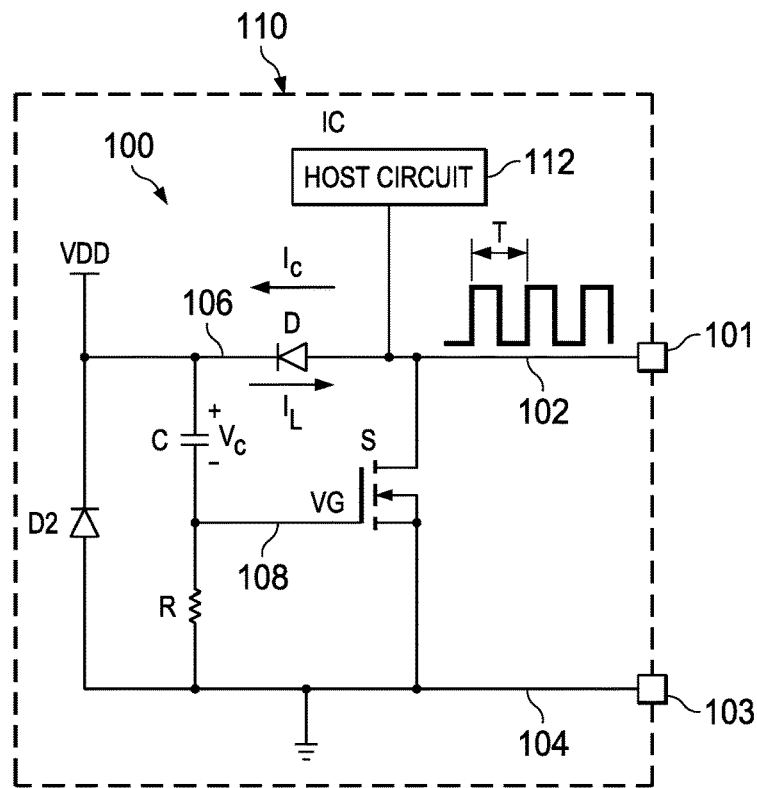
FIG. 8 is a schematic diagram showing an integrated circuit (IC) with an ESD protection circuit including a passive trigger voltage controlled shut-off circuit with a second diode and a supply voltage node connected to the capacitor according to another embodiment.

FIG. 8 shows another integrated circuit embodiment 101 including a passive trigger voltage controlled shut-off circuit with a second diode D2 and a supply voltage VDD connected to the capacitor C at the node 106. In this embodiment, the turn off is very strong and does not depend on the input voltage to charge the capacitor C where the supply voltage VDD is at a higher potential than the pad voltage at the node 102.

Figure 9:
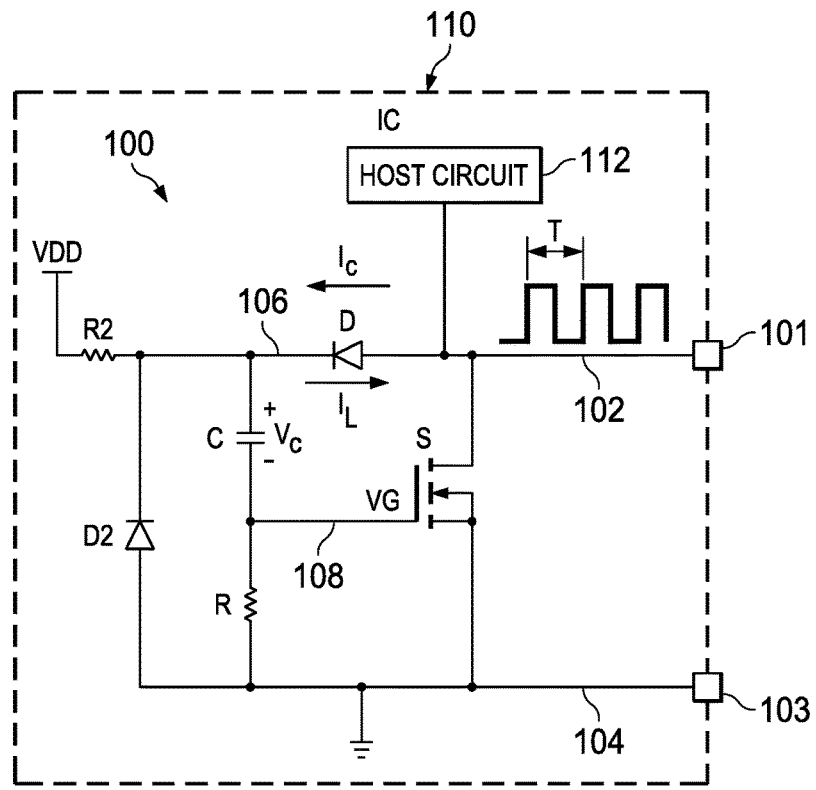
FIG. 9 is a schematic diagram showing an integrated circuit (IC) with an ESD protection circuit including a passive trigger voltage controlled shut-off circuit with a second diode connected to the capacitor and a second resistor connected between the capacitor and a supply voltage node according to another embodiment.

FIG. 9 shows another integrated circuit embodiment 101 that can be used where a pad to supply path is not required. The example of FIG. 9 includes an ESD protection circuit including a passive trigger voltage controlled shut-off circuit as described above, as well as a second diode D2 connected to the capacitor C and a second resistor R2 connected between the node 106 and a supply voltage node VDD. The second resistor R2 can be large enough to ensures that the capacitor C charges up slowly. The resistor R2 also helps contain the ESD event current within the ESD protection circuit 100, and the capacitor C sees a strong dv/dt during ESD events.

The illustrated embodiments provide a capacitor C that operates to enhance the rate-sensitivity of the ESD protection circuit 100, which is rendered dormant during normal operation, and becomes active during ESD events. In certain examples, the charged capacitor C can not displace additional charges across its plates for an impending time varying signal in normal operation. The diode D in the illustrated examples ensures this condition together with the input signal that charges the capacitor C. Since the capacitor C does not provide any boost, the circuit trigger voltage ($V_{t1}$) is high during normal operation to mitigate leakage. When the IC 101 is unpowered prior to an ESD event, the capacitor C is fully discharged and is ready to displace charges across its plates. When an ESD event occurs, a displacement current flows across the capacitor C to pull up the potential of the gate node 108 proportional to the impedance on the gate to reduce the trigger voltage $V_{t1}$. In addition to these desirable ESD cell characteristics, the disclosed examples also reduce the overall capacitance of the ESD protection circuit 100, where the forward biased diode D in series with the capacitor C provides a low capacitance solution viewed from the signal source providing a time-varying signal to the node 102.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The invention claimed is:

1. An electrostatic discharge (ESD) protection circuit, comprising:
   an ESD protection element connected between a protected node and a reference node, the ESD protection element operative according to a control voltage signal at a control node to selectively conduct current from the protected node to the reference node;
   a resistor connected between the control node and the reference node;
   a capacitor connected between the control node and an internal node; and
   a blocking component, connected between the protected node and the internal node, the blocking component providing a conduction path from the protected node to the internal node to allow charging current to flow from the protected node to charge the capacitor, and the blocking component providing a high impedance to the internal node to prevent or mitigate flow of leakage current from the internal node to the protected node;
   wherein the ESD protection circuit does not include a voltage supply node.

2. The ESD protection circuit of claim 1, wherein the blocking component is a diode, including an anode connected to the protected node, and a cathode connected to the internal node.

3. The ESD protection circuit of claim 2, wherein the ESD protection element is an n-channel field effect transistor, including a drain connected to the protected node, a source connected to the reference node, and a gate control terminal connected to the control node to receive the control voltage signal.

4. The ESD protection circuit of claim 3, wherein a capacitance of the capacitor and a size of the diode are selected such that a time constant representing a product of the capacitance and a leakage resistance of the diode is greater than a period of a time-varying signal on the protected node during normal operation.

5. The ESD protection circuit of claim 4, wherein the resistor allows current to flow from the capacitor to the reference node to increase an amplitude of the control voltage signal to turn the transistor on in response to an ESD event causing a voltage rise at the protected node beyond a peak amplitude of the time-varying signal on the protected node.

6. The ESD protection circuit of claim 5, wherein the resistor allows current to flow from the capacitor in response to attenuation of the ESD event when the transistor is on to reduce the amplitude of the control voltage signal to turn the transistor off.

7. The ESD protection circuit of claim 3, wherein the resistor allows current to flow from the capacitor to the reference node to increase an amplitude of the control voltage signal to turn the transistor on in response to an ESD event causing a voltage rise at the protected node beyond a peak amplitude of a time-varying signal on the protected node.

8. The ESD protection circuit of claim 7, wherein the resistor allows current to flow from the capacitor in response to attenuation of the ESD event when the transistor is on to reduce the amplitude of the control voltage signal to turn the transistor off.

9. The ESD protection circuit of claim 2, wherein the resistor allows current to flow from the capacitor to the reference node to increase an amplitude of the control voltage signal to turn the ESD protection element on in response to an ESD event causing a voltage rise at the protected node beyond a peak amplitude of a time-varying signal on the protected node.

10. The ESD protection circuit of claim 9, wherein the resistor allows current to flow from the capacitor in response to attenuation of the ESD event when the ESD protection element is on to reduce the amplitude of the control voltage signal to turn the ESD protection element off.

11. The ESD protection circuit of claim 1, wherein the resistor allows current to flow from the capacitor to the reference node to increase an amplitude of the control voltage signal to turn the ESD protection element on in response to an ESD event causing a voltage rise at the protected node beyond a peak amplitude of a time-varying signal on the protected node.

12. The ESD protection circuit of claim 11, wherein the resistor allows current to flow from the capacitor in response to attenuation of the ESD event when the ESD protection element is on to reduce the amplitude of the control voltage signal to turn the ESD protection element off.

13. The ESD protection circuit of claim 1, wherein the protected node is connected to an I/O pad of an integrated circuit.

14. An integrated circuit, comprising:
an I/O pad connected to a protected node;
a host circuit connected to the I/O pad to receive a time-varying signal from an external circuit;
an ESD protection element connected between the protected node and a reference node of the IC;
a resistor connected between a control node and the reference node;
a capacitor connected between the control node and an internal node; and
a blocking component, connected between the protected node and the internal node to prevent or mitigate flow of leakage current from the internal node to the protected node;
wherein there are no voltage supply nodes coupled to the internal node.

15. The IC of claim 14, wherein the blocking component is a diode, including an anode connected to the protected node, and a cathode connected to the internal node.

16. The IC of claim 14, wherein the ESD protection element is an n-channel field effect transistor, including a drain connected to the protected node, a source connected to the reference node, and a gate control terminal connected to the control node to receive the control voltage signal.

17. The IC of claim 16, wherein a capacitance of the capacitor and a size of the diode are selected such that a time constant representing a product of the capacitance and a leakage resistance of the diode is greater than a period of a time-varying signal on the protected node during normal operation.

18. An electrostatic discharge (ESD) protection circuit, comprising:
a transistor, including a drain connected to a protected node, a source connected to a reference node, and a gate control terminal connected to a control node;
a resistor, including a first terminal connected to the control node, and a second terminal connected to the reference node;
a capacitor including a first terminal connected to the control node and a second terminal connected to an internal node; and
a diode, including an anode connected to the protected node, and a cathode connected to the internal node;
wherein the ESD protection circuit does not include a voltage supply node.

19. The ESD protection circuit of claim 18, wherein a capacitance of the capacitor and a size of the diode are selected such that a time constant representing a product of the capacitance and a leakage resistance of the diode is greater than a period of a time-varying signal on the protected node during normal operation.

20. The ESD protection circuit of claim 18, wherein the protected node is connected to an I/O pad of an integrated circuit.

* * * * *